US009923111B2

(12) United States Patent
Fan et al.

(10) Patent No.: US 9,923,111 B2
(45) Date of Patent: Mar. 20, 2018

(54) ILLUMINATION AND RADIATIVE COOLING

(71) Applicant: The Board of Trustees of the Leland Stanford Junior University, Palo Alto, CA (US)

(72) Inventors: Shanhui Fan, Stanford, CA (US); Aaswath Pattabhi Raman, Menlo Park, CA (US); Linxiao Zhu, Stanford, CA (US); Eden Rephaeli, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 10 days.

(21) Appl. No.: 14/540,935

(22) Filed: Nov. 13, 2014

(65) Prior Publication Data

US 2015/0131146 A1 May 14, 2015

Related U.S. Application Data

(60) Provisional application No. 61/903,541, filed on Nov. 13, 2013, provisional application No. 62/019,195, filed on Jun. 30, 2014.

(51) Int. Cl.
*G06K 7/10* (2006.01)
*H01L 31/052* (2014.01)
(Continued)

(52) U.S. Cl.
CPC ............ *H01L 31/052* (2013.01); *G02B 1/005* (2013.01); *G02B 5/208* (2013.01);
(Continued)

(58) Field of Classification Search
CPC ..... F25B 23/003; G02B 5/208; H01L 31/055; H01L 31/048; H01L 31/052; H01L 35/30; Y10S 62/01; G06K 7/10
See application file for complete search history.

(56) References Cited

U.S. PATENT DOCUMENTS 3,591,420 A    7/1971  Streed
4,147,040 A    4/1979  Altman
(Continued)

OTHER PUBLICATIONS

R. Farrington and J. Rugh, "Impact of vehicle air-conditioning on fuel economy, tailpipe emissions, and electric vehicle range," Tech. Rep., National Renewable Energy Laboratory, http://www.nrel.gov/docs/fy00osti/28960.pdf (2000).
(Continued)

*Primary Examiner* — Bumsuk Won
*Assistant Examiner* — Balram Parbadia
(74) *Attorney, Agent, or Firm* — Crawford Maunu PLLC (57) ABSTRACT

Aspects of the present disclosure are directed to providing and/or controlling electromagnetic radiation. As may be implemented in accordance with one or more embodiments, an apparatus includes a first structure that contains an object, and a second structure that is transparent at solar wavelengths and emissive in the atmospheric electromagnetic radiation transparency window. The second structure operates with the first structure to pass light into the first structure for illuminating the object, and to radiatively cool the object while preserving the object's color.

27 Claims, 7 Drawing Sheets

(51) Int. Cl.
    G02B 5/20      (2006.01)
    G02B 1/00      (2006.01)
    H01L 31/0216   (2014.01)
    H01L 31/0236   (2006.01)
(52) U.S. Cl.
    CPC .. H01L 31/02167 (2013.01); H01L 31/02366 (2013.01); *Y02E 10/50* (2013.01)

(56) References Cited

U.S. PATENT DOCUMENTS

| | | | |
|---|---|---|---|
| 4,153,474 | A | 5/1979 | Rex |
| 4,323,619 | A | 4/1982 | Silvestrini et al. |
| 4,423,605 | A | 1/1984 | Petrick et al. |
| 4,586,350 | A | 5/1986 | Berdahl |
| 5,683,804 | A * | 11/1997 | Nagashima ....... B32B 17/10018 428/336 |
| 6,410,362 | B1 | 6/2002 | Simburger et al. |
| 7,368,655 | B2 * | 5/2008 | Blieske ............... F24J 2/062 136/246 |
| 7,503,971 | B2 | 3/2009 | Wojtysiak |
| 2003/0030041 | A1 | 2/2003 | Genjima et al. |
| 2004/0211460 | A1* | 10/2004 | Simburger ............ H01L 31/052 136/246 |
| 2004/0251451 | A1* | 12/2004 | Burgard ............... C03C 17/007 252/520.1 |
| 2005/0064094 | A1 | 3/2005 | Wojtysiak et al. |
| 2005/0247337 | A1 | 11/2005 | Chen et al. |
| 2008/0302406 | A1 | 12/2008 | Ohmi et al. |
| 2010/0155043 | A1 | 6/2010 | Smith |
| 2012/0275017 | A1* | 11/2012 | McCarthy ............ G02B 5/26 359/359 |

OTHER PUBLICATIONS

R. Robb, A. Brooker, L. Ramroth, J. Rugh and K. Smith, "Analysis of off-board powered thermal preconditioning in electric drive vehicles," Tech. Rep., National Renewable Energy Laboratory, http://www.nrel.gov/vehiclesandfuels/vsa/pdfs/49252.pdf (2010).

A. Burdick, "Strategy guideline: Accurate heating and cooling load calculations," Tech. Rep., U.S. Dept. of Energy: Energy Efficiency and Renewable Energy, http://www.nrel.gov/docs/fy11osti/51603.pdf (Jun. 2011).

Smith, Thomas, and John Guild. "The CIE colorimetric standards and their use." Transactions of the Optical Society 33.3 (1931): 73. Abstract Only.

Catalanotti, S., et al. "The radiative cooling of selective surfaces." Solar Energy 17.2 (1975): 83-89. Abstract Only.

Granqvist, C. G. "Radiative heating and cooling with spectrally selective surfaces." Applied optics 20.15 (1981): 2606-2615. Abstract Only.

Granqvist, C. G., and A. Hjortsberg. "Radiative cooling to low temperatures: General considerations and application to selectively emitting SiO films." Journal of Applied Physics 52.6 (1981): 4205-4220. Abstract Only.

Berdahl, P., M. Martin, and F. Sakkal. "Thermal performance of radiative cooling panels." International Journal of Heat and Mass Transfer 26.6 (1983): 871-880. Abstract Only.

Lord, S. D. A New Software Tool for Computing Earth's Atmospheric Transmission of Near- and Far-Infrared Radiation 1992, NASA Technical Memorandum 103957; IR Trans-mission Spectra, Gemini Observatory. http://www.gemini.edu/?q=node/10789.

E. Palik, Handbook of Optical Constants of Solids, vol.s I, II, and III (Elsevier Science & Tech: New York,, 1985). Book.

Nilsson, Torbjorn M., Gunnar A. Niklasson, and Claes-Goeran Granqvist. "Solar-reflecting material for radiative cooling applications: ZnS pigmented polyethylene." Optical Materials Technology for Energy Efficiency and Solar Energy. International Society for Optics and Photonics, 1992. Abstract Only.

Orel, Boris, M. Klanjšek Gunde, and Aleš Krainer. "Radiative cooling efficiency of white pigmented paints." Solar energy 50.6 (1993): 477-482. Abstract Only.

Nilsson, Torbjörn MJ, and Gunnar A. Niklasson. "Radiative cooling during the day: simulations and experiments on pigmented polyethylene cover foils." Solar energy materials and solar cells 37.1 (1995): 93-118. Abstract Only.

Suryawanshi, Chetan N., and Chhiu-Tsu Lin. "Radiative cooling: Lattice quantization and surface emissivity in thin coatings." ACS applied materials & interfaces 1.6 (2009): 1334-1338. Abstract Only.

Smith, G. B. "Amplified radiative cooling via optimised combinations of aperture geometry and spectral emittance profiles of surfaces and the atmosphere." Solar Energy Materials and Solar Cells 93.9 (2009): 1696-1701.

Gentle, Angus R., and Geoffrey B. Smith. "Radiative heat pumping from the earth using surface phonon resonant nanoparticles." Nano letters 10.2 (2010): 373-379. Abstract Only.

Cao, Linyou, et al. "Tuning the color of silicon nanostructures." Nano letters 10.7 (2010): 2649-2654. Abstract Only.

Gentle, A. R., J. L. C. Aguilar, and G. B. Smith. "Optimized cool roofs: integrating albedo and thermal emittance with R-value." Solar Energy Materials and Solar Cells 95.12 (2011): 3207-3215.

T. Bergman, A. Lavine, F. Incropera, and D. DeWitt, Fundamentals of Heat and Mass Transfer, 7th Ed. (Wiley, 2011) pp. 283-285. Book Description Only.

Liu, Victor, and Shanhui Fan. "S 4: A free electromagnetic solver for layered periodic structures." Computer Physics Communications 183.10 (2012): 2233-2244.

Gentle, A. R., K. L. Dybdal, and G. B. Smith. "Polymeric mesh for durable infra-red transparent convection shields: Applications in cool roofs and sky cooling." Solar Energy Materials and Solar Cells 115 (2013): 79-85. Abstract Only.

E. Rephaeli, A. Raman, and S. Fan, "Ultrabroadband Photonic Structures to Achieve High-Performance Daytime Radiative Cooling", Nano Lett. 13, 1457 (2013).

\* cited by examiner

ILLUMINATION AND RADIATIVE COOLING

FEDERALLY-SPONSORED RESEARCH AND DEVELOPMENT

This invention was made with Government support under contract DE-AR0000316 awarded by the Department of Energy. The Government has certain rights in this invention.

FIELD

Aspects of various embodiments are directed to the passing of electromagnetic radiation, with illumination and radiative cooling.

BACKGROUND

Many structures, circuits and other apparatuses benefit from temperature control. For many applications, sunlight is desirably provided to and/or used (e.g., in a solar cell). In addition, the color of an object under sunlight may be determined by the object's absorption spectrum over solar wavelengths. However, this absorption of sunlight in turn will cause the object to heat up to temperatures substantially above ambient air temperatures. For instance, solar cells heat up under sunlight. The resulting increased temperature of the solar cell has adverse consequences on both its efficiency and its reliability. Accordingly, illuminating an object with sunlight or otherwise can result in undesirably high temperatures.

These and other matters have presented challenges to both the illumination of objects and temperature control thereof, for a variety of applications.

SUMMARY

Various example embodiments are directed to methods, apparatuses and their implementation, involving illumination and radiative cooling.

According to an example embodiment, an apparatus includes a first structure that contains an object, and a second structure that is transparent at solar wavelengths and emissive in the atmospheric electromagnetic radiation transparency window. The second structure operates with the first structure to pass light into the first structure for illuminating the object, and to radiatively cool the object while preserving the object's color.

Another embodiment is directed to a method as follows. A first structure is provided, and an object is contained therein. A second structure that is transparent at solar wavelengths and emissive in the atmospheric electromagnetic radiation transparency window, is used for illuminating the object with light by passing the light through the second structure and into the first structure, and for radiatively cooling the object by passing thermal radiation from the object and via the second structure, while preserving the object's color.

The above discussion/summary is not intended to describe each embodiment or every implementation of the present disclosure. The figures and detailed description that follow also exemplify various embodiments.

BRIEF DESCRIPTION OF THE FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving illumination and radiative cooling. While not necessarily so limited, various aspects may be appreciated through a discussion of examples using this context.

Various aspects of the present disclosure are directed toward apparatuses and/or methods as exemplified or supported by aspects of the underlying description/embodiments, involving radiative cooling of an object while passing light having solar wavelengths to the object. Such an approach may, for example, be implemented for preserving the color of the object, or otherwise achieving benefits of passing sunlight to an object while also radiatively cooling the object. The cooling effect may persist in the presence of considerable convective and conductive heat exchange, and for different solar absorptances. Accordingly, daytime radiative cooling can be achieved while maintaining an object's color or otherwise providing solar light to the object for use thereat (e.g., in generating solar energy). For instance, the temperature of an object having a given color is lowered while preserving about all of the object's color as relative to light incident thereupon. Achieving such a color-preserving daytime radiative cooling effect can be implemented to provide energy-free, passive cooling in various situations, such as those in which the color of an object is to be maintained for aesthetic or functional purposes, or in which solar light is desirably passed for energy production.

According to a particular embodiment, an apparatus includes a structure that is transparent at solar wavelengths (e.g., including visible light) and emissive in the atmospheric electromagnetic radiation transparency window (e.g., between 8-13 μm). The structure passes light for illuminating an object, and radiatively cools the object while preserving the object's color. In some implementations, the object is contained in or on another component over which the structure is placed for passing light and thermal radiation, such as by placing a light-passing film or other component over the object and a container/structure in which or on which the object is located. In connection with one or more such embodiments, it has been recognized/discovered that such cooling may involve, for example, providing a non-radiative heat exchange coefficient as large as 40 W/m²/K at an ambient temperature of 300 K with an equivalent of direct sunlight striking the structure, reducing the temperature of the object by 7.7 K at 900 W/m² incident solar absorption, and/or otherwise reducing the object's temperature by at least 31K (e.g., 31.4 K).

The structure or structures implemented for passing light and radiative cooling are implemented in a variety of manners to suit particular embodiments. For instance, a light-passing layer or grid may be implemented to pass the illumination light to the object and also emit/pass thermal radiation from the object. In some embodiments, an array of SiO₂ (e.g., quartz) bars or other components are used to pass electromagnetic radiation in this regard. In certain more specific embodiments, a periodic array of quartz bars with 10 μm periodicity is provided, in which each quartz bar has a square cross section of 7 μm. Further, the second structure can suppress the absorption in at least some wavelengths in the visible spectrum.

As may be implemented with one or more embodiments herein, such a structure overcomes an impedance mismatch with air (e.g., between silica and air) at a broad range of wavelengths to promote radiative cooling. For instance, impedance mismatch can be reduced or eliminated at phonon-polariton resonant wavelengths. Such an approach can provide a gradual refractive index change. In some implementations, periodicity in the structure provides a spatial gradient in effective dielectric function to overcome such an impedance mismatch at thermal wavelengths.

A variety of objects may be cooled in manners as described herein. In some implementations, clothing is cooled by promoting thermal radiation while maintaining color of the clothing as viewed. Similarly, overheating of devices whose efficiency seriously degrades at higher temperature, such as outdoor electronic devices, can be prevented or reduced. For instance, in a more particular embodiment the object being cooled is a solar cell that generates charge carriers in response to incident light in the solar wavelengths. Solar light is passed to the solar cell, and thermal radiation is passed from the solar cell, through a structure as noted above. In some implementations, the structure includes a light-passing layer that passes incident light to the solar cell and radiatively cools the solar cell structure by passing thermal electromagnetic radiation emitted from the solar cell (and any enclosure/structure that the solar cell is in or on). In a more particular embodiment, a multilayer film of dielectric material having varying indices of refraction is placed over the light-passing layer, which may be implemented with such a solar cell having a reflective conductor. For instance, each layer in the film may have a thickness of between 100 nm and 10 μm, and which may include layers of the dielectric material. Such light-passing layers may be implemented to provide thermal emissivity and absorptivity of electromagnetic radiation having wavelengths between 4-100 microns while maintaining more than a 0.8 average transmission of solar light having wavelengths between 250 nm-4 microns to the solar cell. Accordingly, heat absorption in at least some wavelengths in the visible spectrum can be suppressed.

Another embodiment is directed to a method as follows. An object is illuminated and radiatively cooled using a structure that is transparent at solar wavelengths and emissive in the atmospheric electromagnetic radiation transparency window. The structure is arranged relative to the object for passing illumination light (e.g., at solar wavelengths that include visible light) through to the object, and for passing thermal radiation from the object while preserving the object's color (e.g., as viewed). In some implementations, the object is contained and/or placed on another structure, and the illumination light is directed into the other structure for illuminating the object, while thermal radiation is passed from the object and other structure.

The radiative cooling is carried out in a variety of manners. In some implementations, a non-radiative heat exchange coefficient of about 40 W/m²/K is provided at an ambient temperature of 300 K under conditions in which direct sunlight strikes the object and/or a structure in which the object is contained. In other implementations, an array of SiO₂ bars is placed over the object (and any structure in which it is contained), and used to pass light of solar wavelengths to the object as well as to pass the thermal radiation from the object. In these or other implementations, the temperature of the object can be reduced by at least 31K at an ambient temperature of 300K while illuminating the object by passing sunlight through the second structure (e.g., with the temperature reduction being relative to direct exposure of the object to the sunlight). In certain implementations, the array of SiO₂ bars is provided (e.g., placed, or manufactured) with the bars having a cross-section of about 7 μm and a periodicity of about 10 μm between the bars, thereby providing.

In a more particular embodiment, the object includes a solar cell that generates charge carriers in response to incident light in the solar wavelengths. The solar cell is contained and illuminated via light at the solar wavelengths as passed through a light-passing layer. The solar cell is radiatively cooled by passing thermal electromagnetic radiation emitted from the solar cell via the light-passing layer at wavelengths in the atmospheric electromagnetic radiation transparency window.

Another embodiment is directed to an apparatus having a solar cell, which may be implemented with one or more embodiments as noted above. A light-passing (e.g., silica or glass) layer is arranged over the solar cell, and both passes light to the solar cell and passes radiation from the solar cell to provide cooling thereof. Accordingly, light is passed to the solar cell, which generates power from the light, and thermal radiation is allowed to pass through the thin (e.g., between 100 nm to 10 μm) light-passing layer, therein cooling the solar cell. In some implementations, the solar cell is located on a substrate having upper and lower surfaces, with the solar cell being arranged over or on the upper surface. Such an approach may enhance thermal emissivity and absorptivity of radiation having a wavelength of 4-100 microns while maintaining more than a 0.8 average transmission of solar light having wavelengths of 250 nm-4 microns to the solar cell structure. Cooling may be achieved in this regard, to provide a reduction of temperature of between 10-25 degrees Celsius, at least 15 degrees Celsius, or at least 20 degrees Celsius.

In some embodiments, a multilayer film is located over or on a surface of the light-passing layer, over the solar cell. In certain implementations, the multilayer film includes layers of dielectric material, with the respective layers having varying indices of refraction. Such an approach may be implemented with the solar cell being on a reflective conductor substrate.

Various embodiments are also implemented in accordance with one or more embodiments in U.S. Provisional Patent Application Nos. 61/903,541 and/or 62/019,195, which are fully incorporated herein by reference. In particular, for information regarding details of other embodiments, experiments and applications that can be combined in varying degrees with the teachings herein, reference may be made to the experimental teachings and underlying references provided in the Provisional Patent Applications, including those in the appendices that form part of the applications. For instance, various embodiments may be implemented for cooling different types of objects, such as solar cells. Embodiments discussed in the underlying provisional applications (and the appendices therein) are not necessarily intended, in any way, to be limiting to the overall technical disclosure, or to any part of the claimed invention unless specifically noted.

Various embodiments are directed to cooling a variety of structures. In some embodiments, a structure at temperature T and having a spectral and angular emissivity $\in(\lambda, \Omega)$ is cooled. If the structure is exposed to a clear sky, and is subject to solar irradiance, and atmospheric irradiance corresponding to an ambient temperature $T_{amb}$. The net cooling power per unit area of a structure, $P_{net}(T)$, is given by $$P_{net}(T) = P_{rad}(T) - P_{atm}(T_{amb}) - P_{sun} \quad (1)$$

where $$P_{rad}(T) = \int d\Omega \cos\theta \int_0^\infty d\lambda I_{BB}(T,\lambda) \in(\lambda,\Omega) \quad (2)$$

is the power radiated by the structure per unit area, $$P_{atm}(T_{atm}) = \int d\Omega \cos\theta \int_0^\infty d\lambda I_{BB}(T_{amb},\lambda) \in(\lambda,\Omega) \in_{atm}(\lambda, \Omega) \quad (3)$$

is the absorbed power per unit area emanating from the atmosphere, and $$P_{sun} = \int_0^\infty d\lambda \in(\lambda,0) I_{AM1.5}(\lambda) \quad (4)$$

is the incident solar power absorbed by the structure per unit area. Here, $\int d\Omega = \int_0^{\pi} d\theta \int_0^{2\pi} d\varphi$ is the angular integral over a hemisphere. $I_{BB}(T,\lambda) = (2hc^2/\lambda^5)/[e^{hc/(\lambda k_B T)} - 1]$ is the spectral radiance of a blackbody at temperature T, where h, c, $k_B$ and $\lambda$, are the Planck constant, the velocity of light, the Boltzmann constant, and wavelength respectively. In obtaining Eq. 3 and Eq. 4, Kirchhoff's law may be used to replace the structure's absorptivity with its emissivity $\in(\lambda, \Omega)$. The angle-dependent emissivity of the atmosphere is given by $\in_{atm}(\lambda, \Omega) = 1 - t(\lambda)^{1/\cos\theta}$, where $t(\lambda)$ is the atmospheric transmittance in the zenith direction. In Eq. 4, the solar illumination is represented by AM1.5 Global Tilt spectrum with an irradiance of 964 W/m², which represents the average solar conditions of the continental U.S. If the structure is facing the sun, the term $P_{sun}$ is devoid of an angular integral, and the structure's emissivity is represented by its value in the zenith direction, $\theta = 0$.

In accordance with one or more embodiments, a modified structure is provided with an emissivity/absorptivity spectrum that facilitates illumination and radiative cooling of an object. To preserve the color of an object while lowering the object's temperature via radiative cooling, the modified structure maintains the original structure's absorptivity at solar wavelengths while being highly emissive at thermal wavelengths. Generally, $(P_{rad} - P_{atm})$ does not dominate the solar absorption, and for $T = T_{amb}$, $P_{net} < 0$, the structure heats up even with radiative cooling, reaching an equilibrium temperature $T > T_{amb}$. However, with the large $(P_{rad} - P_{atm})$ added by the radiative cooling, the modified structure can reach thermal equilibrium at a lower temperature than a structure that is not modified in this regard. In some implementations, absorptivity is unchanged or nearly unchanged at solar wavelengths (e.g., to preserve the color), while emissivity is unity or nearly unity at thermal wavelengths. This design may be derived by maximizing $(P_{rad} - P_{atm})$, when $T > T_{amb}$. From the emissivity/absorptivity spectrum in such a design, at $T = T_{amb} = 300$ K, $P_{rad}(T) = 424$ W/m², $P_{atm}(T_{amb}) = 209$ W/m², and $P_{rad} - P_{atm} = 215$ W/m². The large $(P_{rad} - P_{atm})$, though smaller than solar absorption $P_{sun}$, cools the structure to a lower temperature compared with the original structure.

In various embodiments, the temperature of a structure is lowered considerably, in the presence of large non-radiative heat exchange. The effects of conductive and/or convective heat exchange may be accounted for by adding a term $P_{cond+conv} = h_c(T - T_{amb})$ with $T > T_{amb}$ in Eq. 1 above. Thermal equilibrium temperature $T_{eq}$ is then determined by:

$$P_{rad}(T_{eq}) - P_{atm}(T_{amb}) - P_{sun} + h_c(T_{eq} - T_{amb}) = 0 \quad (5)$$

Figure 1:
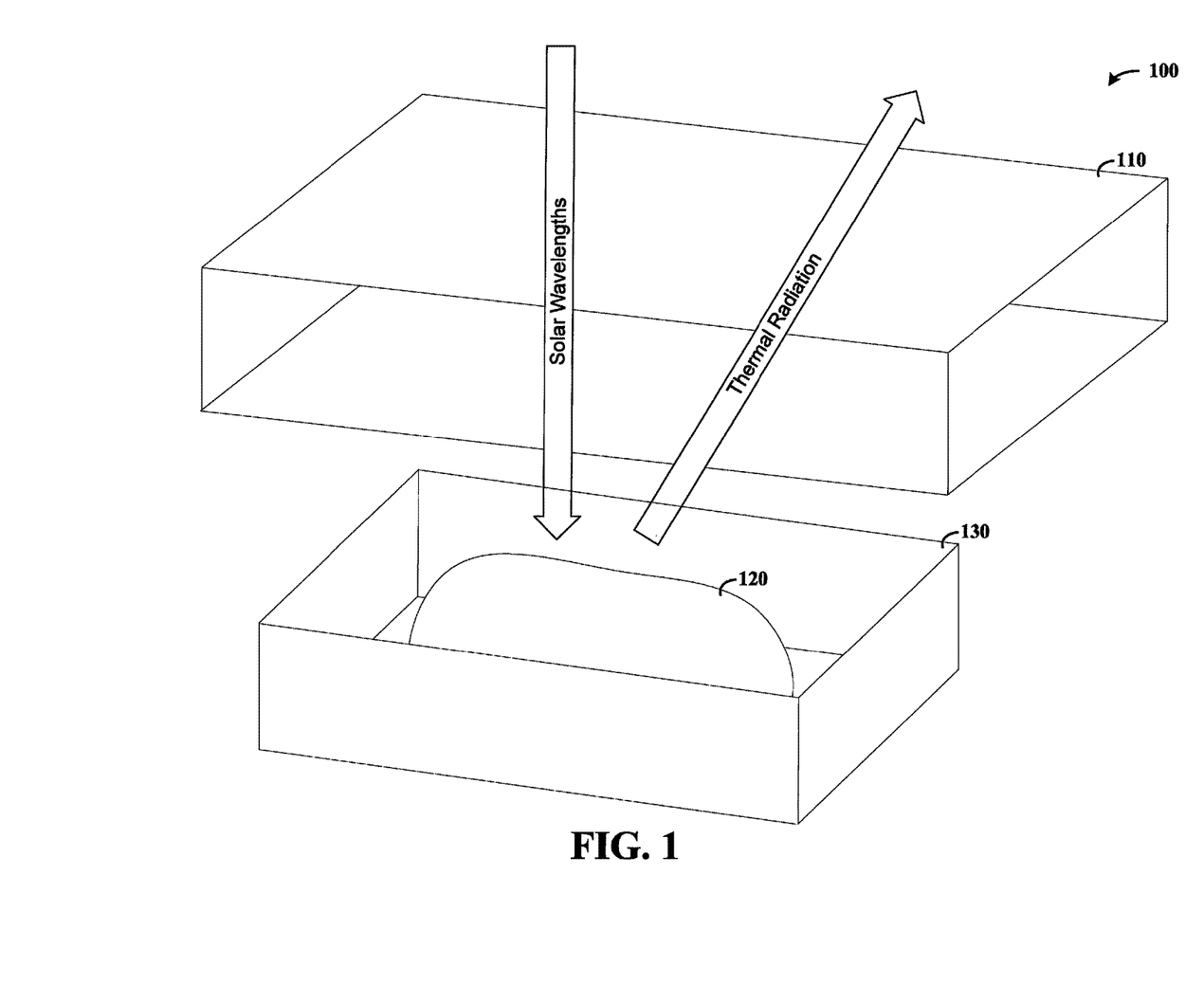
FIG. 1 shows a structure and apparatus, in accordance with one or more embodiments.

For instance, the presence of 1 m/s, 3 m/s and 12 m/s wind speeds would result in a combined non-radiative heat coefficient value $h_c$ of approximately 6, 12, and 40 W/m²/K respectively. In FIG. 1c, we show the dependence of the equilibrium temperature difference $(\Delta T = T_{eq,original} - T_{eq,modified})$ between the original structure and the modified structure on ho, for different $P_{sun}$. The modified structure achieves considerably lower equilibrium temperatures than the original structure across a large range of $h_c$. It has been recognize/discovered that, even with the presence of non-radiative heat exchange coefficient as large as $h_c = 40$ W/m²/K, the temperature reduction is a meaningful 7.7 K for 900 W/m² incident solar absorption (a value that corresponds to the sun's irradiance at mid-day).

Color-preserving radiative cooling may also be implemented, in accordance with various embodiments, in a robust manner against different values of solar absorption $(P_{sun})$. Using Eq. 5 both for the original and modified structures, exploiting the fact that for the original structure $P_{atm}(T_{amb}) \approx 0$, $P_{rad}(T) \approx 0$ (when T is not exceedingly high so that thermal emission at solar wavelengths is negligible), and that solar absorption is the same between two structures, provides:

$$\Delta T = T_{eq,original} - T_{eq,modified} \quad (6)$$

$$\approx \frac{P_{rad,modified}(T_{eq,modified}) - P_{atm,modified}(T_{amb})}{h_c}$$

As $P_{rad,modified}(T_{eq,modified})$ increases as $T_{eq,modified}$, and $T_{eq,modified} > T_{amb}$, Eq. 6 provides:

$$\Delta T \geq \frac{P_{rad,modified}(T_{amb}) - P_{atm,modified}(T_{amb})}{h} \quad (7)$$

Eq. 7 becomes an equality when heating is negligible (e.g., $T_{eq,modified} \approx T_{amb}$ as may be implemented for large $h_c$ and small $P_{sun}$). Eq. 7 is independent of the absorptivity at solar wavelengths, as at terrestrial ambient temperatures $T = T_{amb}$, the corresponding thermal radiation spectrum does not extend into solar wavelengths. Thus, Eq. 7 provides a lower bound on the achievable temperature reduction. When $T_{amb}$=300 K, Eq. 7 amounts to $$\Delta T \geq \frac{215 \text{ W/m}^2}{h_c},$$

which is a general lower bound for $\Delta T$ between the original structure and the modified structure, and independent of solar absorption. Therefore, at $T_{amb}$=300 K, the temperature reduction is at least 18 K for $h_c$=12 W/m²/K (corresponding to 3 m/s wind speed), and 5.4 K for $h_c$=40 W/m²/K (corresponding to 12 m/s wind speed). The lower bound for temperature reduction provided by Eq. 7 may be consistent with actual calculations for different $P_{sun}$. In the regime of $h_c$<1 W/m²/K, which is far from most practical situations, a violation of Eq. 7 may occur. In such a case, the heating of the original structure is so strong that the thermal radiation partially extends into solar wavelengths, making $P_{rad}$ non-negligible for the original structure. Eq. 7 can thus be used to estimate temperature reduction.

In a more particularly color-preserving approach, a silicon nanostructure having a periodic array of silicon nanowires are placed on top of an aluminum substrate. The silicon nanowires have a square cross section with 100 nm side length, and the periodicity between the nanowires is 500 nm. Using the rigorous coupled-wave analysis (RCWA) method (e.g., as in V. Liu and S. Fan, Comput. Phys. Commun. 183, 2233 (2012), which is incorporated herein by reference). Absorptivity may be averaged for both polarizations at normal incidence, with the emissivity of the structure at thermal wavelengths being negligible with substantial solar absorption present at optical wavelengths. The CIE 1931 chromaticity coordinates of the original structure for normal incidence reflection, and averaged over two polarizations, are (x=0.3598; y=0.3342), which corresponds to a light pink color (e.g., as determined in accordance with T. Smith and J. Guild, Trans. Opt. Soc. 73 (1931), which is fully incorporated herein by reference). To preserve the color of the silicon nanostructure while lowering its temperature via radiative cooling, a material that is transparent at solar wavelengths while strongly emissive in the atmospheric transparency window between 8-13 μm is placed on the silicon nanostructure. In some embodiments, α-Quartz is implemented in this regard, to provide phonon-polariton resonances at the relevant thermal wavelengths and transparency over visible wavelengths.

Figure 2:
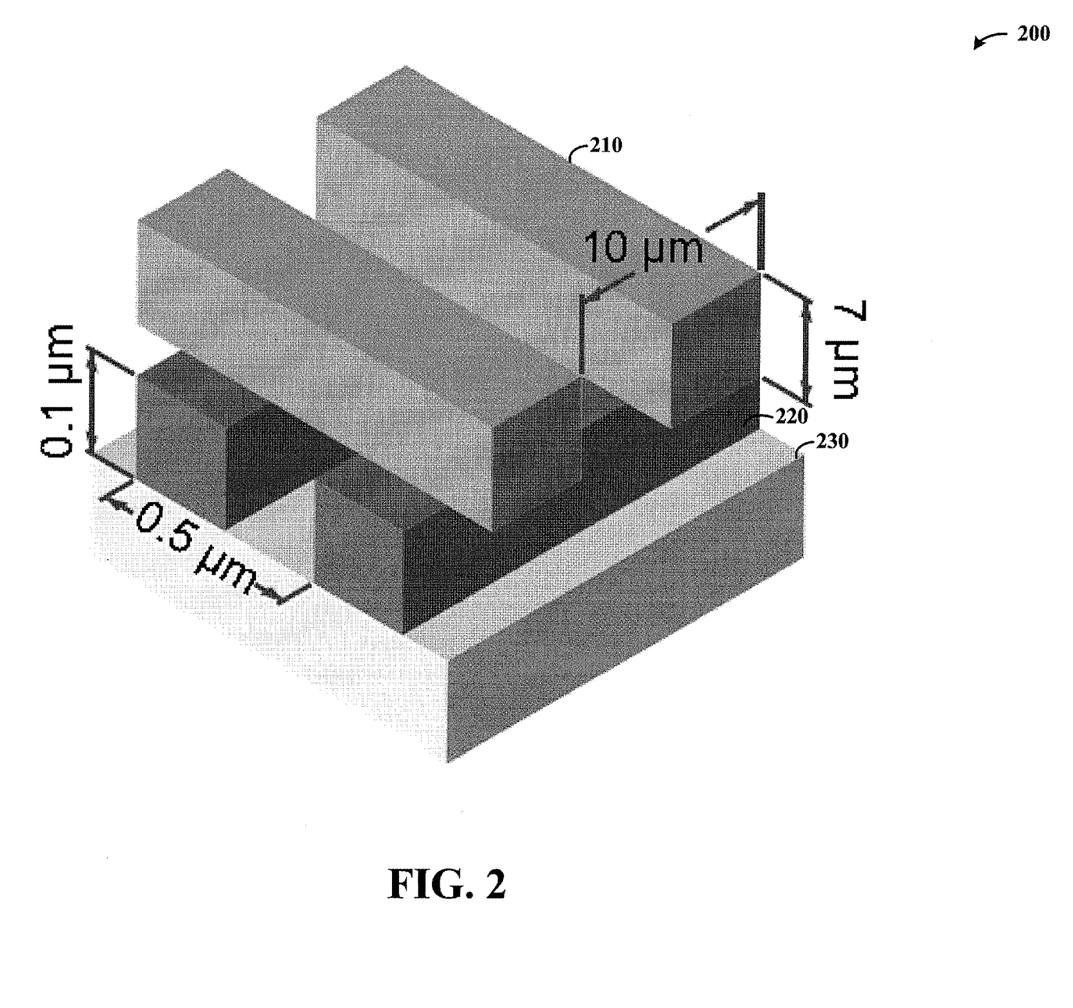
FIG. 2 shows an apparatus, in accordance with another example embodiment.

Turning now to the Figures, FIG. 1 shows a structure 110 and apparatus 100, in accordance with one or more embodiments. The structure 110 provides transparency for passing light that illuminates an object 120 at solar wavelengths, while also passing thermal radiation from the object 120. This passing of light and thermal radiation may, for example, be carried out in accordance with one or more embodiments discussed herein, such as for preserving color of the object 120 or providing light for photovoltaic applications (e.g., a solar cell), while also providing radiative cooling. The structure 110 may, for example, be implemented with layers on an upper surface thereof, or other materials consistent with one or more embodiments herein (e.g., as shown in FIG. 2). In some implementations, the object 120 is placed on or within a structure 130, upon which the structure 110 may be placed. Accordingly, various embodiments are directed to the structure 110, and other embodiments are directed to an apparatus 100 that includes the structure 110, object 120 and structure 130.

FIG. 2 shows an apparatus 200, in accordance with another example embodiment. The apparatus 200 includes quartz bars with bar 210 labeled by way of example, on an underlying structure (e.g., silicon nanowires) including bar 220 labeled by way of example, over a substrate 230. The quartz bars may be implemented in various shapes, sizes and spacings, shown by example as having a square cross section with a 7 μm side length, and periodicity between the quartz bars of 10 μm. While two bars are shown in each layer by way of example, a multitude of such bars may be implemented in a similar fashion.

Figure 3:
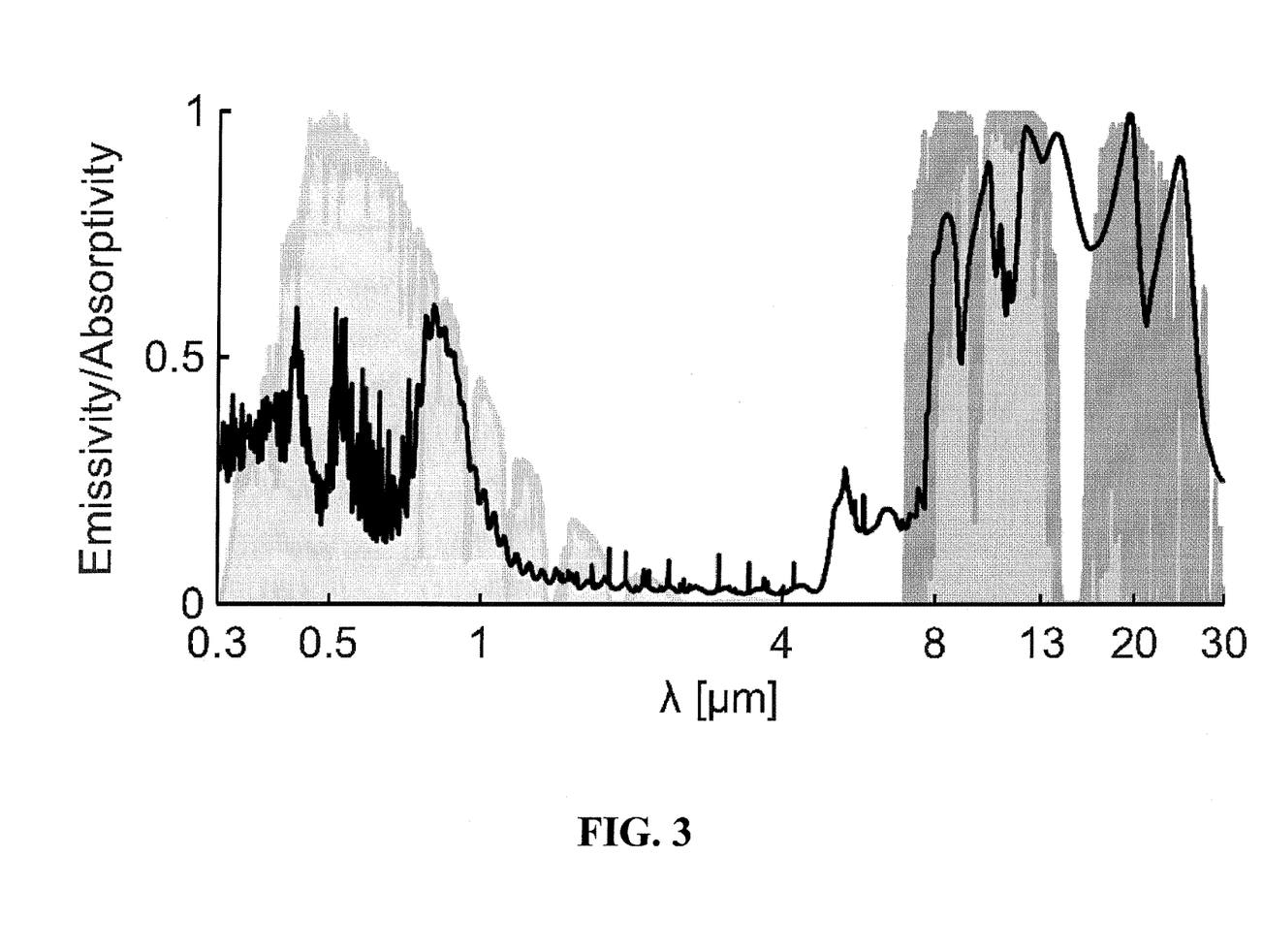
FIG. 3 shows a plot of emissivity/absorptivity for an apparatus and/or method in accordance with one or more embodiments.

FIG. 3 shows a plot of emissivity/absorptivity over a wavelength range of 0.3-30 microns for an apparatus and/or method in accordance with one or more embodiments, with the normalized atmospheric transmission shown as the darker grey shading in this figure. Such characteristics may, for example, be implemented with the apparatus 200 in FIG. 2 with the quartz bars facilitating large emissivity at thermal wavelengths while the absorption spectrum in the visible range is almost entirely unchanged, maintaining color of underlying components.

Figure 4:
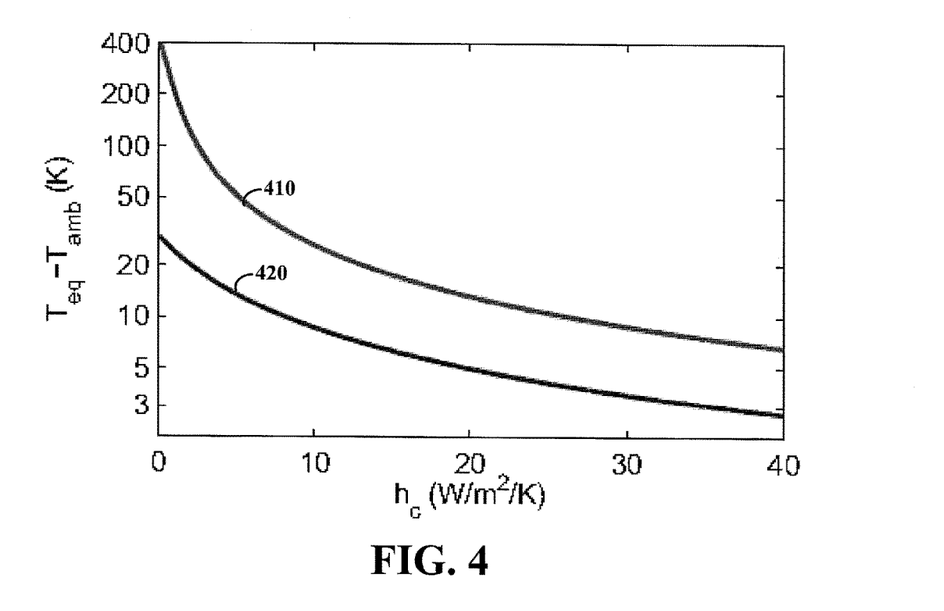
FIG. 4 shows a plot of temperature versus heat exchange characteristics, in accordance with one or more embodiments.

FIG. 4 shows a plot of temperature versus heat exchange characteristics, in accordance with one or more embodiments. The vertical axis shows equilibrium temperature ($T_{eq}$) subtracted by ambient temperature $T_{amb}$=300 K, with a non-radiative heat exchange coefficient $h_c$ shown on the horizontal axis, as may be implemented with an apparatus such as shown in FIG. 2. Plot 410 represents a structure unmodified (e.g., without a light-passing/emissive structure), and plot 420 represents a modified structure having a quartz bar array such as shown in FIG. 2. Under sunlight, both unmodified and modified structures heat up considerably, but $T_{eq}$ for the modified structure with quartz bars is considerably lower.

Figure 5:
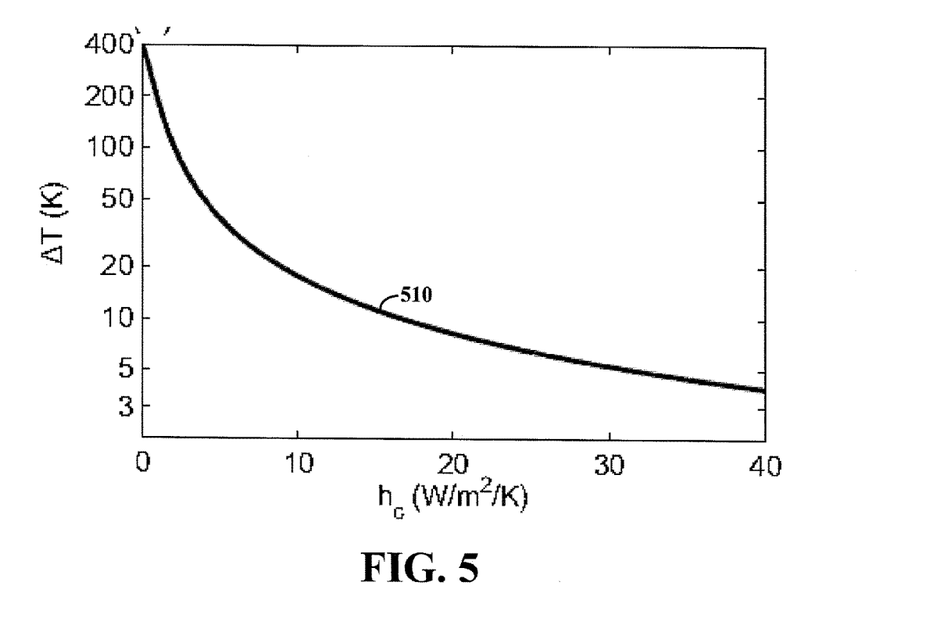
FIG. 5 shows a plot of a temperature difference as a function of heat exchange, as may be implemented with one or more embodiments.

FIG. 5 shows a plot 510 of a temperature difference ($\Delta T$) between equilibrium temperatures for the original and the modified structures, as a function of $h_c$. The modified structure has a meaningfully lower equilibrium temperature even for large values of $h_c$. Using such an approach in various contexts, a temperature reduction as shown can be achieved for about 31.4 K for $h_c$=6 W/m²/K (corresponding to 1 m/s wind speed), 14.[[:]]4 K for $h_c$=12 W/m²/K (corresponding to 3 m/s wind speed), and 4 K for a non-radiative heat exchange coefficient as large as $h_c$=40 W/m²/K (corresponding to 12 m/s wind speed). Therefore, the added quartz bars can lower the temperature of an underlying structure by a meaningful amount under direct sunlight, even in the presence of considerable non-radiative heat exchange associated with wind or thermal contact.

While various embodiments herein characterize the use of silicon, other materials can be used to achieve similar effects. For example, the temperature of a structure may be lowered while illuminating that structure (e.g., for preserving color or photovoltaic use), utilizing a microstructure of optically-transparent thermally-emissive materials like quartz or $SiO_2$ characterized above, or other materials that provide similar transparency and emissivity. Fused silica, glass, plastic and other light-passing materials may also be used.

Figure 6:
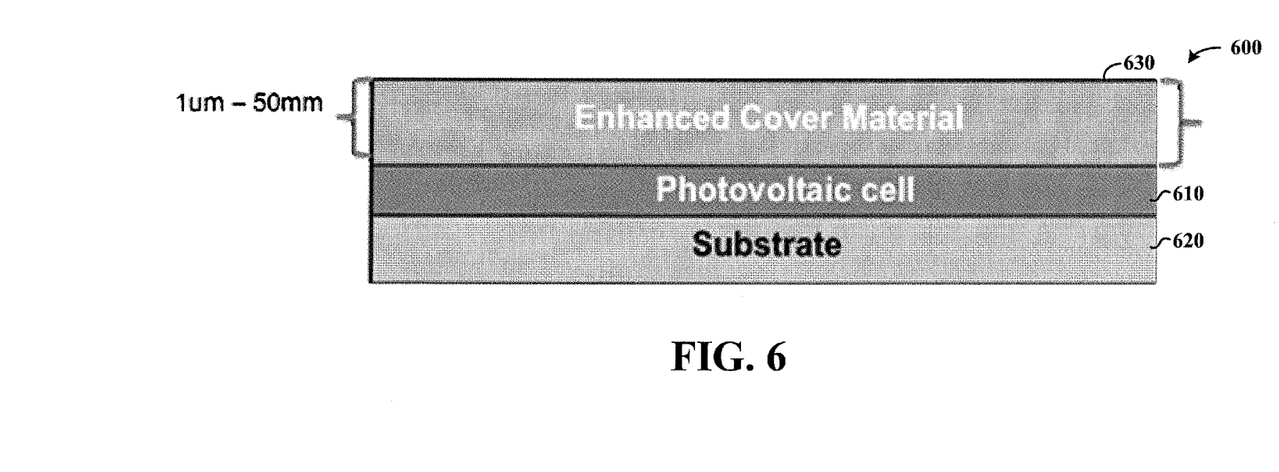
FIG. 6 shows a photovoltaic apparatus, in accordance with another example embodiment.

FIG. 6 shows a photovoltaic apparatus 600, in accordance with another example embodiment. The apparatus 600 includes a photovoltaic cell 610 on a substrate 620, with a cover material 630 over the photovoltaic cell 610. The cover material 630 is an enhanced cover material that improves thermal emissivity of photovoltaic cell while cooling the cell, using approaches as characterized herein. By way of example, the cover material 630 is shown having exemplary thickness. In some implementations, thermal emissivity is provided from 4 µm-100 µm while maintaining greater than 0.8 average transmission (weighted to the relevant solar spectrum) of light over solar wavelengths (e.g., from 250 nm-4 microns). The photovoltaic cell 610 (and those characterized elsewhere herein) may be implemented with silicon (mono- and poly-crystalline, amorphous), CdTe, GaAs, CZTS, CIGS, organic photovoltaic materials and multi junction cells.

Figure 7:
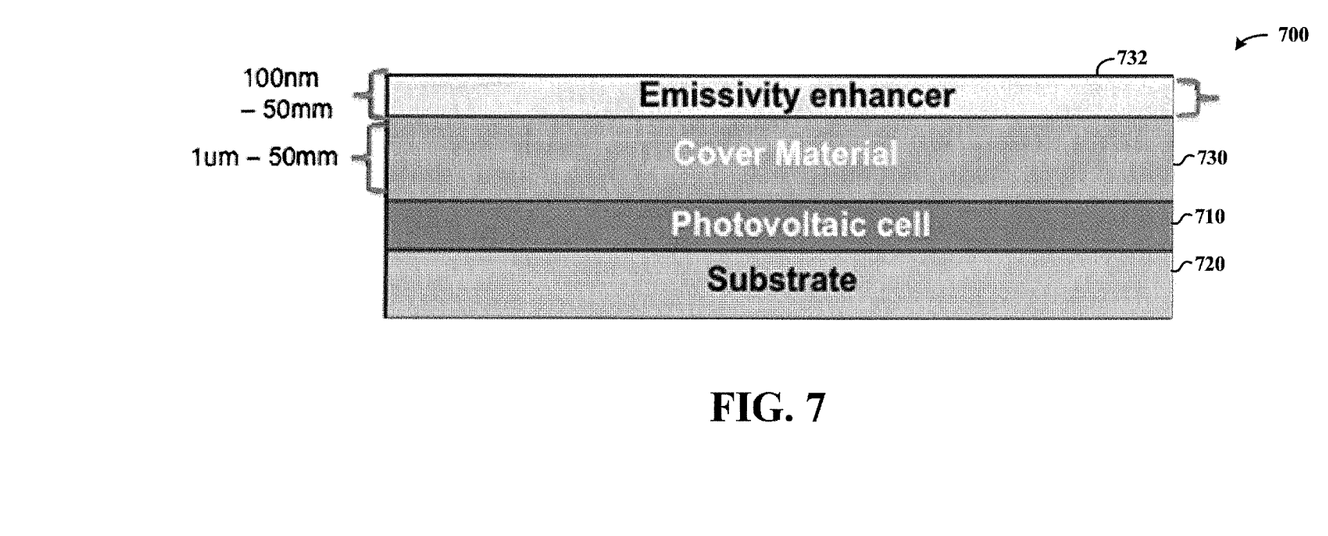
FIG. 7 shows another photovoltaic apparatus, in accordance with another example embodiment.

FIG. 7 shows another photovoltaic apparatus 700, in accordance with another example embodiment. The apparatus 700 includes a photovoltaic cell 710 on a substrate 720, with a cover material 730 over the photovoltaic cell and an emissivity enhancer 732 on the cover material, with exemplary thicknesses shown. The emissivity enhance 732 improves thermal emissivity of the photovoltaic cell 710, such as in a manner characterized with FIG. 6.

Figure 8:
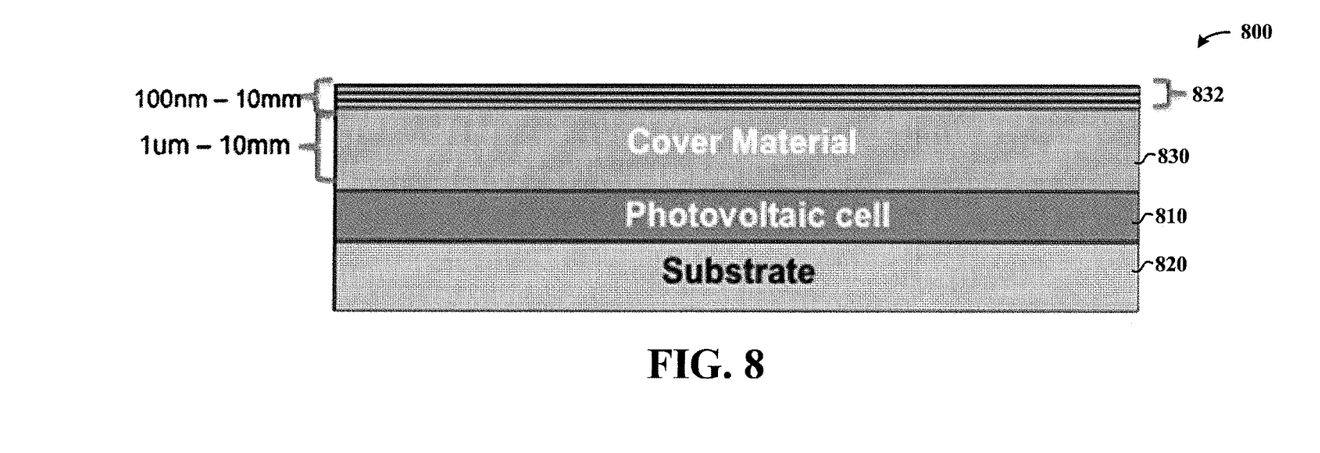
FIG. 8 shows another photovoltaic apparatus, in accordance with another example embodiment.

FIG. 8 shows another photovoltaic apparatus 800, in accordance with another example embodiment. The apparatus 800 includes a photovoltaic cell 810 on a substrate 820, with a cover material 830 over the photovoltaic cell and a multilayer portion 832 on the cover material, with exemplary thicknesses shown. The planar film layers at 832, which may be implemented in accordance with multilayer structures characterized herein, provide emissivity and transparency characteristics such as those characterized with FIG. 6.

Figure 9:
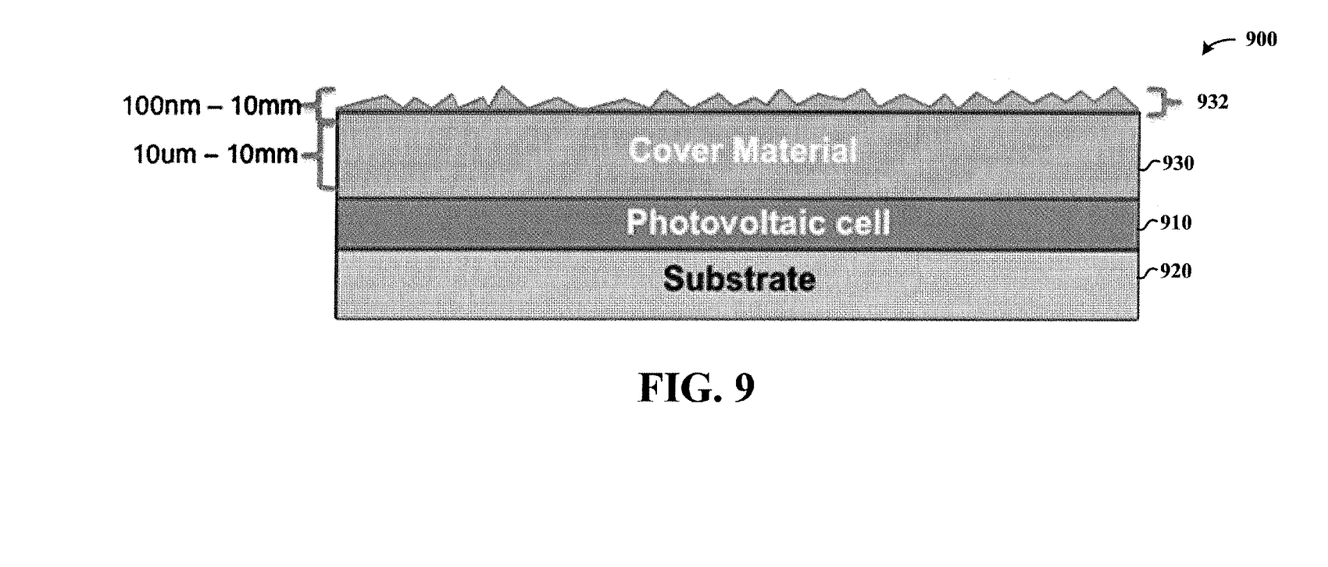
FIG. 9 shows another photovoltaic apparatus, in accordance with another example embodiment.

FIG. 9 shows another photovoltaic apparatus 900, in accordance with another example embodiment. The apparatus 900 includes a photovoltaic cell 910 on a substrate 920, with a cover material 930 over the photovoltaic cell and a non-planar top layer 932 on the cover material, with exemplary thicknesses shown. The non-planar top layer 932 (e.g., patterned portions of cover material 930) enhances thermal emissivity of the photovoltaic cell 910, such as characterized with FIG. 6.

In some embodiments as may be implemented with FIGS. 6-9, microphotonic structures can be achieved through a one-dimensional multilayer films on top of a thick, bulk silica film, which improves performance of such a film in IR wavelengths around 8-11 microns where the bulk silica film is reflective and not emissive. Further, in certain embodiments, a multilayer film (such as characterized elsewhere herein) includes of alternating layers of dielectric material with varying indices of refraction (high and low). Example materials include, but are not limited to, $SiO_2$, $TiO_2$, $HfO_2$, $MgF_2$ and $Al_2O_3$. Interference effects and the intrinsic absorption of these layers are exploited to provide emissivity in regions where the bulk silica/glass is a weak thermal emitter (e.g., between 8-11 microns where there is a large emissivity dip).

Figure 10:
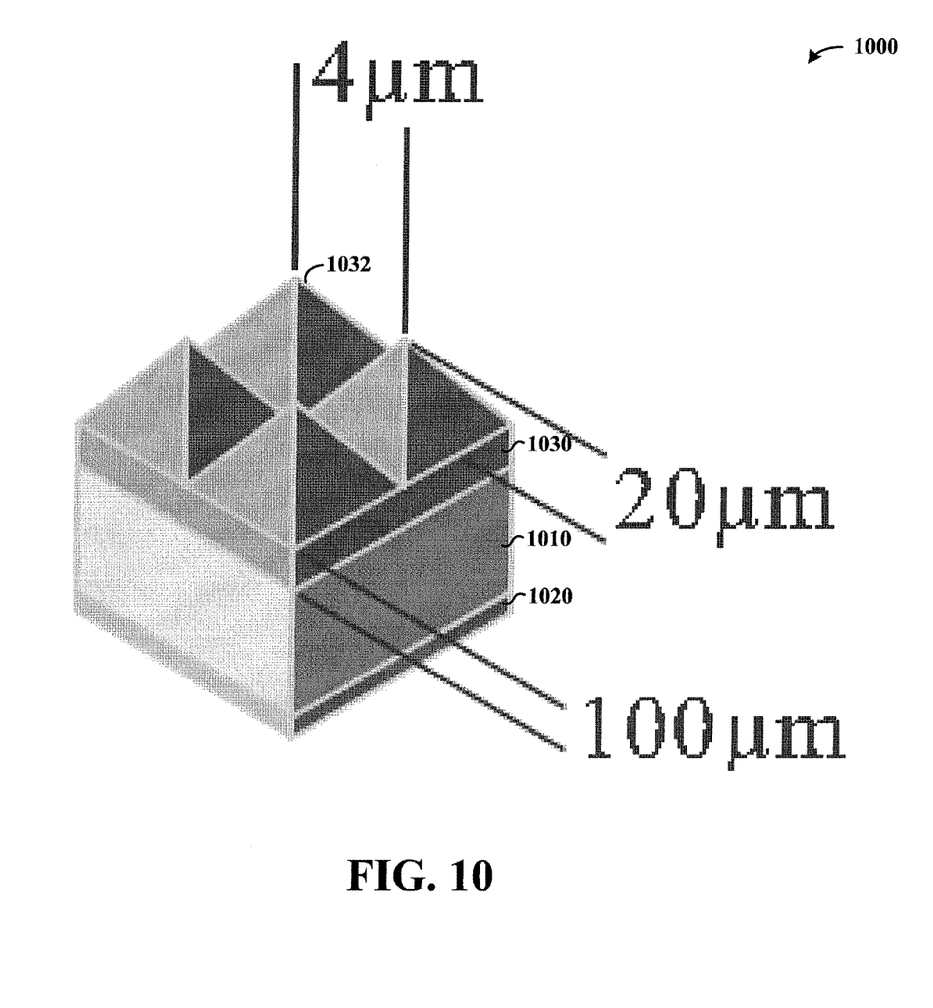
FIG. 10 shows another apparatus, in accordance with another example embodiment.

FIG. 10 shows another apparatus 1000, in accordance with another example embodiment. The apparatus 1000 includes an electronic device 1010, such as a solar cell, on a substrate 1020. A silica layer 1030 on the electronic device 1010 includes pyramid structures 1032, and operates to pass light into the electronic device and pass thermal radiation from the electronic device. By way of example, dimensions are shown in FIG. 10, in which the apparatus 1000 may be expanded (e.g., providing an array of a multitude of the pyramids 1032). Specifically, the square lattice of silica pyramids 1032 is provided with 4 µm periodicity and 20 µm height, on top of a 100 µm-thick uniform silica layer. In some embodiments, at 800 W/m² solar heating power with device 1010 implemented as a solar cell, the temperature reduction of the silica pyramid is 17.6 K relative to, compared with the bare solar cell (without silica layer 1030). Such a temperature drop may result in a relative efficiency increase of about 7.9%. If the solar cell efficiency is 20%, this temperature drop corresponds to a 1.6% absolute efficiency increase. The absence of sharp resonant features associated with silica phonon-polariton resonances and hence broad-band near-unity absorption is achieved via the pyramids 1032, which provide a gradual refractive index change that overcomes the impedance mismatch between silica and air at a broad range of wavelengths including the phonon-polariton resonant wavelengths. Further, the silica pyramids 1032 have a size of several microns, and is significantly larger than wavelengths in the solar spectrum. Due to this strong size contrast, the silica pyramid does not degrade solar absorptivity, which may be achieved in the presence of an anti-reflection layer. This silica pyramid structure is compatible with anti-reflection coating design, by not degrading the solar absorptivity of the solar cell.

While pyramidal structures are shown in FIG. 10, various embodiments are directed to nanocone or microcone structures with a similar aspect ratio. Such structures may be fabricated using various methods, including Langmuir-Blodgett assembly and etching, and metal-dotted pattern and etching. In some implementations, such structures are implemented with superhydrophobicity and self-cleaning functionality, via rounded tips or microcone patterning. This functionality mitigates or prevents dust accumulation which could otherwise block sunlight and impair performance. In various implementations, the periodicity of silica pyramid structures as characterized herein may be altered within the structure, while providing a spatial gradient in effective dielectric function to overcome the impedance mismatch between silica and air at thermal wavelengths.

The embodiments and specific applications discussed herein may be implemented in connection with one or more of the above-described aspects, embodiments and implementations, as well as with those shown in the figures. Various embodiments may also be implemented in connection with the underlying provisional patent applications referenced above, including the Appendices therein that form part of the provisional applications.

As illustrated, various modules and/or other circuit-based building blocks may be implemented to carry out one or more of the operations and activities described herein or in the Appendices, and/or shown in the block-diagram-type figures. In such contexts, these modules and/or building blocks represent circuits that carry out one or more of these or related operations/activities. For example, in certain of the embodiments, one or more modules and/blocks are discrete logic circuits or programmable logic circuits configured and arranged for implementing these operations/activities, as in the circuit modules/blocks that may involve solar power generator or other functions. In certain embodiments, the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules/blocks include a combination of a CPU hardware-based circuit and a set of instructions in the form of firmware, where the first module/block includes a first CPU hardware circuit with one set of instructions and the second module/block includes a second CPU hardware circuit with another set of instructions.

While the present disclosure is amenable to various modifications and alternative forms, specifics thereof have been shown by way of example in the drawings and will be described in further detail. It should be understood that the intention is not to limit the disclosure to the particular embodiments and/or applications described. Various embodiments described above and shown in the figures and attachments may be implemented together and/or in other manners. One or more of the items depicted in the drawings/figures can also be implemented in a more separated or integrated manner, as is useful in accordance with particular applications.

What is claimed is:

1. An apparatus comprising:
an object including an electronic device configured and arranged to convert energy of light directed at the object into electricity; and
a second structure characterized by a layer of arrayed material with shaped regions separated to mitigate an impedance mismatch between the second structure and an ambient atmosphere through which the directed light is passed, the second structure being sufficiently transparent at solar wavelengths and concurrently sufficiently emissive in at least one atmospheric electromagnetic radiation transparency window, the second structure being configured and arranged to pass sufficient light towards the object for illuminating the object and for radiatively cooling the object while preserving the object's color, and to emit in the at least one atmospheric electromagnetic radiation transparency window, electromagnetic radiation having wavelengths in a range that is between about 8 μm and 30 μm, while maintaining transparency characterized by a normalized atmospheric transmission of greater than 0.5 for the solar wavelengths between 250 nm-4 microns.

2. The apparatus of claim 1, wherein the second structure is configured and arranged to preserve the object's color by passing incident light to the object at solar wavelengths that include visible light, wherein the at least one atmospheric electromagnetic radiation transparency window provides a normalized atmospheric transmission of greater than 0.8 for solar light having wavelengths between 250 nm-4 microns, and wherein the shaped regions of the layer of arrayed material are separated to mitigate the impedance mismatch between the second structure and the ambient atmosphere through which the directed light is passed at the range of wavelengths between about 8 μm and 30 μm to promote radiative cooling.

3. The apparatus of claim 1, wherein the second structure is on a top portion of a first structure and configured and arranged to control electromagnetic radiation passing into and out of the first and second structures, and wherein the second structure is predominantly transparent at solar wavelengths, wherein the apparatus is configured and arranged to preserve the object's color by maintaining the object's absorptivity at the solar wavelengths while being emissive in the at least one atmospheric electromagnetic radiation transparency window, wherein the first structure is configured and arranged to contain the object, and the shaped regions of the layer of arrayed material are configured and arranged to provide a spatial gradient in effective dielectric function to mitigate the impedance mismatch.

4. The apparatus of claim 1, wherein the second structure is configured and arranged to cool the object at a non-radiative heat exchange coefficient of about 40 W/m²/K at an ambient temperature of 300 K with direct sunlight striking the second structure, by passing electromagnetic radiation emitted from the object, and wherein the second structure is transparent at solar wavelengths and emissive in at least one atmospheric electromagnetic radiation transparency window in a wavelength range of 8-13 microns.

5. The apparatus of claim 1, wherein the shaped regions of the layer of arrayed material includes an array of $SiO_2$ bars configured and arranged to provide transparency at the solar wavelengths and emissivity at electromagnetic wavelengths in the at least one atmospheric electromagnetic radiation transparency window, wherein the array of $SiO_2$ bars includes at least two layers of $SiO_2$ bars, wherein a first layer of $SiO_2$ bars are arranged in a first pattern and a second layer of $SiO_2$ bars are arranged in a second pattern that is crisscrossed with respect to the first pattern, and wherein the second structure is transparent at solar wavelengths of at least 0.8 average transmission.

6. The apparatus of claim 1, wherein the shaped regions of the layer of arrayed material includes a periodic array of $SiO_2$ bars, each $SiO_2$ bar having a square cross section of about 7 μm, with periodicity between the $SiO_2$ bars being 10 the periodic array of $SiO_2$ bars being configured and arranged to provide transparency at the solar wavelengths and emissivity at electromagnetic wavelengths in the at least one atmospheric electromagnetic radiation transparency window.

7. The apparatus of claim 1, wherein the second structure shaped regions of the layer of arrayed material includes an array of bars that include $SiO_2$ and are configured and arranged to provide transparency at the solar wavelengths and emissivity at electromagnetic wavelengths in the at least one atmospheric electromagnetic radiation transparency window.

8. The apparatus of claim 1, wherein the second structure is further configured and arranged to provide a temperature reduction of the object by about 31K, at an ambient temperature of 300K while the object is illuminated by sunlight passing through the second structure.

9. The apparatus of claim 1, wherein the at least one atmospheric electromagnetic radiation transparency window provides transmission of electromagnetic radiation having wavelengths of between about 8-13 μm, wherein the shaped regions of the layer of arrayed material includes a pattern of shaped regions arranged in a periodicity, the shaped regions being configured and arranged to provide a spatial gradient in effective dielectric function to mitigate the impedance mismatch between the second structure and the ambient atmosphere at thermal wavelengths.

10. The apparatus of claim 1, wherein the object is the electronic device.

11. The apparatus of claim 1, wherein the at least one atmospheric electromagnetic radiation transparency window is configured to provide transmission of electromagnetic radiation having wavelengths between about 8 μm and 13 μm.

12. The apparatus of claim 1, wherein the at least one atmospheric electromagnetic radiation transparency window is configured to provide transmission of electromagnetic radiation having wavelengths between about 20 μm and 25 μm.

13. The apparatus of claim 1, wherein the at least one atmospheric electromagnetic radiation transparency window is configured to provide transmission of electromagnetic radiation having wavelengths between about 8 μm and 13 μm and between about 20 μm and 25 μm.

14. The apparatus of claim 1, wherein the at least one atmospheric electromagnetic radiation transparency window is configured to provide transmission of electromagnetic radiation having wavelengths that do not include wavelengths between about 13 μm and about 20 μm.

15. The apparatus of claim 1, wherein the at least one atmospheric electromagnetic radiation transparency window is configured to provide transmission of electromagnetic radiation that have wavelengths between about 8 μm and 13 μm and between about 20 μm and 25 μm, and that do not include wavelengths between about 13 μm and about 20 μm.

16. The apparatus of claim 1, wherein the at least one atmospheric electromagnetic radiation transparency window is configured to provide transmission of electromagnetic radiation that have wavelengths in a range that is either between about 8 μm and 13 μm or between about 20 μm and 25 μm, and excluding wavelengths between about 13 μm and about 20 μm.

17. A method comprising:
providing an object including an electronic device configured and arranged to convert energy of light directed at the object into electricity; and
using a second structure characterized by a layer of arrayed material with shaped regions separated to mitigate an impedance mismatch between the second structure and an ambient atmosphere through which the directed light is passed, the second structure being transparent at solar wavelengths and concurrently emissive in at least one atmospheric electromagnetic radiation transparency window, and configured and arranged to emit in the at least one atmospheric electromagnetic radiation transparency window, by electromagnetic radiation having wavelengths of between about 8 μm and 30 μm, while maintaining transparency characterized by a normalized atmospheric transmission of greater than 0.5 for the solar wavelengths between 250 nm-4 microns,
illuminating the object with light by passing the light through the second structure towards the object, and
radiatively cooling the object by passing thermal radiation from the object and via the second structure, while preserving the object's color, wherein the second structure is sufficiently transparent and sufficiently emissive to carry out the steps of illuminating the object and of radiatively cooling the object.

18. The method of claim 17, wherein illuminating the object with the light includes preserving the object's color by passing incident light to the object at solar wavelengths that include visible light, and wherein the second structure is predominantly transparent at solar wavelengths.

19. The method of claim 17, wherein radiatively cooling the object includes providing a non-radiative heat exchange coefficient of about 40 W/m²/K at an ambient temperature of 300 K with direct sunlight striking the second structure, by passing electromagnetic radiation emitted from the object, and wherein the second structure is transparent at solar wavelengths of at least 0.8 average transmission.

20. The method of claim 17, wherein radiatively cooling the object includes placing the second structure, including an array of SiO₂ bars, over the object, and using the array of SiO₂ bars to pass light at the solar wavelengths to the object and to pass thermal radiation from the object.

21. The method of claim 20, further including providing the array of SiO₂ bars having a cross section of about 7 μm and being arranged with a periodicity between the SiO₂ bars of about 10 μm, thereby providing the illumination and radiative cooling.

22. The method of claim 17, wherein radiatively cooling the object includes using the second structure to reduce the temperature of the object by about 31K at an ambient temperature of 300K while illuminating the object by passing sunlight through the second structure.

23. The method of claim 17, wherein the second structure is transparent at solar wavelengths and emissive in at least one atmospheric electromagnetic radiation transparency window in a wavelength range of 8-13 microns.

24. An apparatus comprising:
an electronic device configured and arranged to convert energy of light directed at an object into electricity; and
a light-passing structure over the electronic device, the light-passing structure characterized by a layer of arrayed material with shaped regions separated to mitigate an impedance mismatch between the light-passing structure and an ambient atmosphere through which the directed light is passed, the light-passing structure being configured and arranged to pass incident electromagnetic radiation at solar wavelengths to the electronic device which solar wavelengths include ultraviolet, visible, and infrared, to concurrently emit thermal radiation in at least one atmospheric electromagnetic radiation transparency window, and to emit in the at least one atmospheric electromagnetic radiation transparency window, electromagnetic radiation having wavelengths of between about 8 μm and 30 μm, while maintaining transparency characterized by a normalized atmospheric transmission of greater than 0.5 for the solar wavelengths between 250 nm-4 microns.

25. The apparatus of claim 24, wherein the layer of arrayed material with shaped regions includes an array of bars that include SiO₂ and are configured and arranged to provide a spatial gradient in effective dielectric function to mitigate the impedance mismatch.

26. The apparatus of claim 24, wherein the light-passing structure exhibits a periodic shape that facilitates emissivity at thermal wavelengths from the apparatus while the apparatus is configured to absorb in the visible range of light.

27. The apparatus of claim 24, wherein the light-passing structure is on the electronic device and configured and arranged to interact with ambient atmosphere to inhibit overheating of the electronic device by enhancing radiativity of the electronic device, relative to radiativity of the electronic device without the light-passing structure on the electronic device.

* * * * *